United States Patent

[11] 3,613,111

[72] Inventors Thomas O. Paine
Administrator of the National Aeronautics and Space Administration, with respect to an invention of;
Larry W. Moede, 1170 Keats St., Manhattan Beach, Calif.

[21] Appl. No. 873,259
[22] Filed Nov. 3, 1969
[45] Patented Oct. 12, 1971

[54] WIDE RANGE ANALOG-TO-DIGITAL CONVERTER WITH A VARIABLE GAIN AMPLIFIER
6 Claims, 5 Drawing Figs.

[52] U.S. Cl. ........ 340/347 AD
[51] Int. Cl. ........ H03k 13/175
[50] Field of Search ........ 340/347; 235/154

[56] References Cited
UNITED STATES PATENTS

| | | | |
|---|---|---|---|
| 2,974,315 | 3/1961 | Lebel et al. | 340/347 |
| 3,072,332 | 1/1963 | Margopoulos | 340/347 X |
| 3,133,278 | 5/1964 | Millis | 340/347 |
| 3,460,131 | 8/1969 | Gorbatenko | 340/347 |
| 2,956,157 | 10/1960 | Graham | 340/347 X |
| 3,299,421 | 1/1967 | Neitzel | 340/347 |

*Primary Examiner*—Maynard R. Wilbur
*Assistant Examiner*—Charles D. Miller
*Attorneys*—J. H. Warden, Paul F. McCaul and G. T. McCoy

ABSTRACT: A wide range analog-to-digital converter comprising a variable gain operational amplifier to which the analog input voltage is applied. The output of the amplifier is supplied to a plurality of comparators, each one comparing the amplifier output with respect to a different threshold level and providing a true output which affects the amplifier's gain. The combined outputs of the comparators represents the converter's output digital representation.

LARRY WILLIAM MOEDE
*INVENTOR.*

BY Paul F. McCaul
T. Ian McCoy
ATTORNEYS

| INPUT VOLTAGE | DIGITAL REPRESENTATION | | | | OUTPUT OF DECODER 30 | | |
|---|---|---|---|---|---|---|---|
| V<0.001 | 0 | 0 | 0 | 0 | 0 | 0 | 0 |
| 0.001 ≤ V<0.01 | 1 | 0 | 0 | 0 | 0 | 0 | 1 |
| 0.01 ≤ V<0.1 | 1 | 1 | 0 | 0 | 0 | 1 | 0 |
| 0.1 ≤ V<1 | 1 | 1 | 1 | 0 | 0 | 1 | 1 |
| 1 ≤ V | 1 | 1 | 1 | 1 | 1 | 0 | 0 |

LARRY WILLIAM MOEDE
INVENTOR.

BY
ATTORNEYS

LARRY WILLIAM MOEDE
*INVENTOR.*

*BY* [signature]
ATTORNEYS

WIDE RANGE ANALOG-TO-DIGITAL CONVERTER WITH A VARIABLE GAIN AMPLIFIER

ORIGIN OF INVENTION

The invention described herein was made in the performance of work under a NASA contract and is subject to the provisions of Section 305 of the National Aeronautics and Space Act of 1958, Public Law 85–568 (72 Stat. 435; 42 U.S.C. 2457).

BACKGROUND OF THE INVENTION

1. Field of the Invention

The present invention generally relates to an analog-to-digital converter and, more particularly, to an analog-to-digital converter with a variable gain amplifier.

2. Description of the Prior Art

A natural phenomenon is generally expressable by the properties of an analog signal, such as the amplitude of a voltage, while control and analysis circuitry, such as computers, are generally of the digital type. This fundamental difference is generally bridged by resort to conversion equipment, such as an analog-to-digital converter (ADC), which in essence is a quantizing device. The conversion accuracy is generally a function of the analog input range versus the digital output range. Alternately stated, the conversion accuracy depends on the analog input range which each digital output is assumed to represent.

In the prior art ADC's capable of digitizing analog inputs, hereafter referred to as voltages, whose amplitudes vary over an extremely wide range, such as 1000 to 1, the range being from a few millivolts (mv.) to several volts, are quite complex, bulky and relatively expensive if high accuracy is desired. Consequently, such ADC's cannot be employed where severe accuracy, weight and bulk restraints are present. Such restraints are generally present when the equipment has to form part of a system for use in a space vehicle or the like. Thus, a need exists for a new ADC which is not limited by disadvantages, characterizing existing ADC's.

OBJECTS AND SUMMARY OF THE INVENTION

It is a primary object of the present invention to provide a new improved ADC.

Another object of the invention is to provide an ADC which is particularly adapted to respond to a wide range of amplitudes of analog input signals.

A further object of the invention is to provide a highly reliable, accurate and relatively simple ADC, to which input voltages from several millivolts to several volts are assumed to be supplied, to provide digital outputs in response thereto.

Still a further object of the invention is to provide an accurate ADC, which is adapted to integrated circuit fabrication techniques, to result in a small light unit, designed to provide digital outputs in response to voltages which vary in amplitude over a wide range.

These and other objects of the invention are achieved by providing an amplifier to which the input voltages are applied. Associated with the amplifier is a gain control unit for controlling the amplifier's gain, which is variable over a wide range. The amplifier's output is supplied to a plurality of latching voltage comparators, each one having a different threshold level, which when equalled or exceeded by the amplifier output latches the comparator to provide a true output. The output of each comparator is used to affect the gain control unit to vary the amplifier's gain. At the end of each measurement the outputs of the various comparators represent the input voltage. The number of the comparators is a function of the voltage range and the desired conversion accuracy.

DESCRIPTION OF THE PREFERRED EMBODIMENTS

Figure 1:
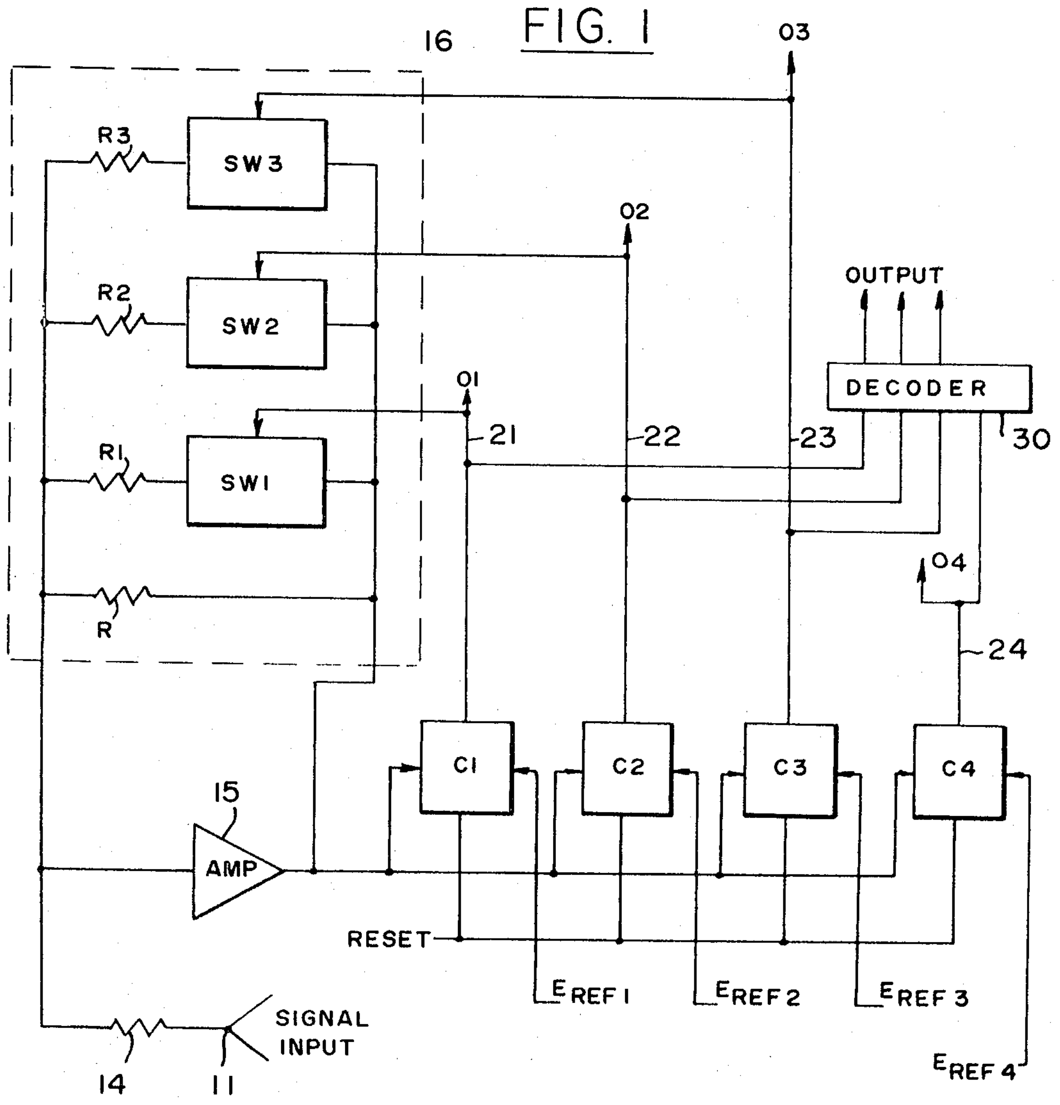
FIG. 1 is a block diagram of one embodiment of the present invention.
Figure 2:
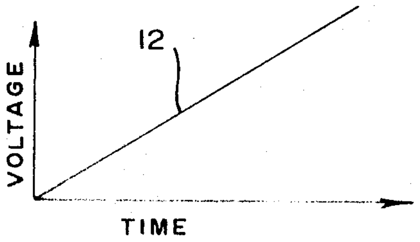
FIG. 2 is a simple diagram of the waveform of an analog input voltage.

Reference is now made to FIG. 1 which is a general block diagram of one embodiment of the ADC of the present invention. In this embodiment the number of comparators is limited to four, for explanatory purposes only. The four comparators are designated C1–C4, with the outputs of the four representing a four digit number which is a function of the input voltage at an input terminal 11. As will be appreciated from the following description this embodiment is capable of responding to an input voltage which does not decrease in amplitude from one measurement to the next, such as the ramp-shaped waveform represented in FIG. 2 by line 12.

The input terminal 11 is connected through an input resistor 14 to an amplifier 15. The latter is assumed to be highly stable, whose gain is variable over a wide range. Preferably, the amplifier is an operational amplifier whose gain is controlled by the resistance provided across it. The resistance is provided by a gain control unit 16, which is shown comprising a resistor R, connected directly across the amplifier's input and output lines, and three branches, connected in parallel with resistor R. The number of branches is always one less than the number of comparators. Each branch, is associated with a different comparator except the last one. Each branch comprises a resistor in series with a switch, designated R and SW respectively, followed by the numeral suffix of the comparator with which they are associated. Thus, R1 and SW1 are associated with C1, R2 and SW2 with C2, and R3 and SW3 with C3.

The switches are of the normally open (NO) type. Each is closed, placing its associated resistor in parallel across the amplifier 15, only when its associated comparator provides a true output, present on its output lines. The output lines of the four comparators are designated by numerals 21–24 and their outputs are designated 01–04. The four outputs represent a four digit number which is a function of the input voltage amplitude.

Each comparator is connected to a different source of reference potential or voltage which establishes a different threshold level for the comparator. The reference voltages for comparators C1–C4 are designated $E_{REF1}$–$E_{REF4}$, respectively. As previously indicated, a comparator provides a true output, assumed to be a binary 1, only when the amplifier output is not less than its threshold level. Otherwise, the comparator's output is false, representing a binary 0. The four comparators are shown connected to a reset line 25 through which reset pulses may be applied to the comparators.

The reference potentials $E_{REF1}$–$E_{REF4}$ and the values of resistors R and R1–R3 are chosen to provide any desired digital representations for any desired voltage ranges. For example, the reference potentials $E_{REF1}$–$E_{REF4}$ may be set to be 1, 3, 5 and 7 volts respectively and the values of resistors R, R1–R3 chosen so that when all three switches SW1–SW3 are open, the amplifier gain is 1000, when only switch SW1 is closed, R and R1 in parallel control the gain to be 300. However, when only switch SW3 is open, R, R1 and R2 control the gain to be 50, while a gain of 7 is realized when all three switches are closed. In such a case, the digital output will be representative of logarithmic segments in a voltage range from 0 to 1 volt.

In such an embodiment, when the input voltage is less than 0.001 volt (1 mv.) even with a gain of 1000 the reference potential of C1, i.e., $E_{REF}$=1 volt is not exceeded. Consequently, all four comparators provide false outputs for a combined representation of 0000. However, when the input voltage reaches 0.001 volt, with a gain of 1000 the output of amplifier 15 is 1 volt. Consequently, C1 is turned ON, providing a true output which closes SW1. Thus, the digital representation becomes 1000, and the gain drops to 300 so that the amplifier's output drops to 0.30 volt. However, since the comparators are of the latching type once C1 is latched, it is not affected by the decrease in the amplifier's output below its threshold level of 1 volt.

The comparator C1 will remain the only one providing a true output as long as the input voltage is below 0.01 volt. However, once this level is reached, with a gain of 300 , the amplifier's output is 3 volts, which turns ON C2, resulting in a representation of 1100 and the closing of SW2. Thus, the gain is reduced to 50. Then, when the input voltage is 0.1 volt, the amplifier's output is 5 volts, turning ON C3. Consequently, the digital representation becomes 1110, and switch SW3 is closed so that the gain drops to 7. When the input voltage reaches 1 volt, the amplifier's output is 7 volts, activating the last comparator C4. Thus, the digital representation becomes 1111.

Figures 3, 4:
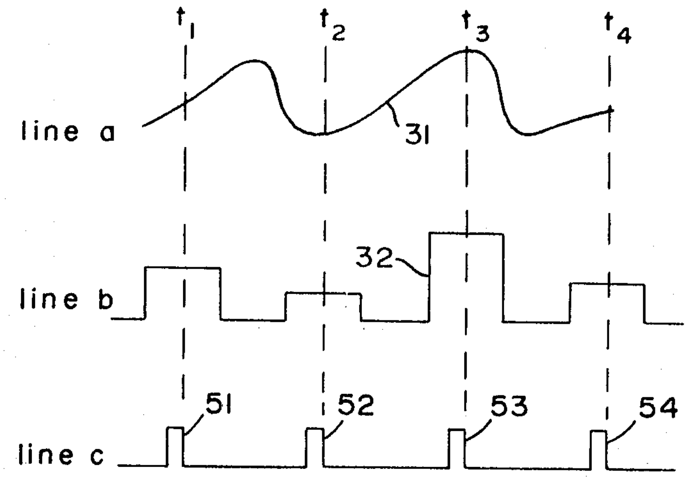
FIG. 3 is a chart of the conversion characteristics of one example of the embodiment shown in FIG. 1.
FIG. 4 is a multiline diagram of a waveform useful in explaining another embodiment of the invention.

The digital representations as a function of input voltage for the foregoing-described example are listed in chart form in FIG. 3. Therefrom, it becomes apparent that the digital representations represent different logarithmic segments of the voltage range between 0 and 1 volt. In the particular example, with four comparators, five different digital representations or outputs are provided. As is appreciated, five such outputs may be represented by three digit binary numbers. This may be accomplished by supplying outputs 01–04 to a decoder 30 whose outputs are three digit binary representations as listed in the right-hand column of FIG. 3, where the rightmost digit is the least significant.

From the foregoing it should be appreciated that the circuit shown in FIG. 1 is a simple ADC, capable of providing multidigit representations as a function of analog input signals which vary over a wide range, such as 1000, from 0 to 1 volt. By controlling the potential references of the comparators and the values of the resistors in unit 16, the analog-to-digital conversion relationship is controlled. Also, by controlling the number of comparators, the conversion accuracy is controlled.

By utilizing the variable gain amplifier, the input range, such as 1000, is converted to a much smaller range, such as 1:7, which simplifies the comparators' operation. Furthermore, by raising the output voltage of the amplifier to be 1 or more volts, relatively simple and inexpensive, yet accurate, comparators may be employed. All the components or devices, shown in FIG. 1 lend themselves to integrated circuit fabrication techniques, thereby enabling the production of a light and small ADC.

Figure 5:
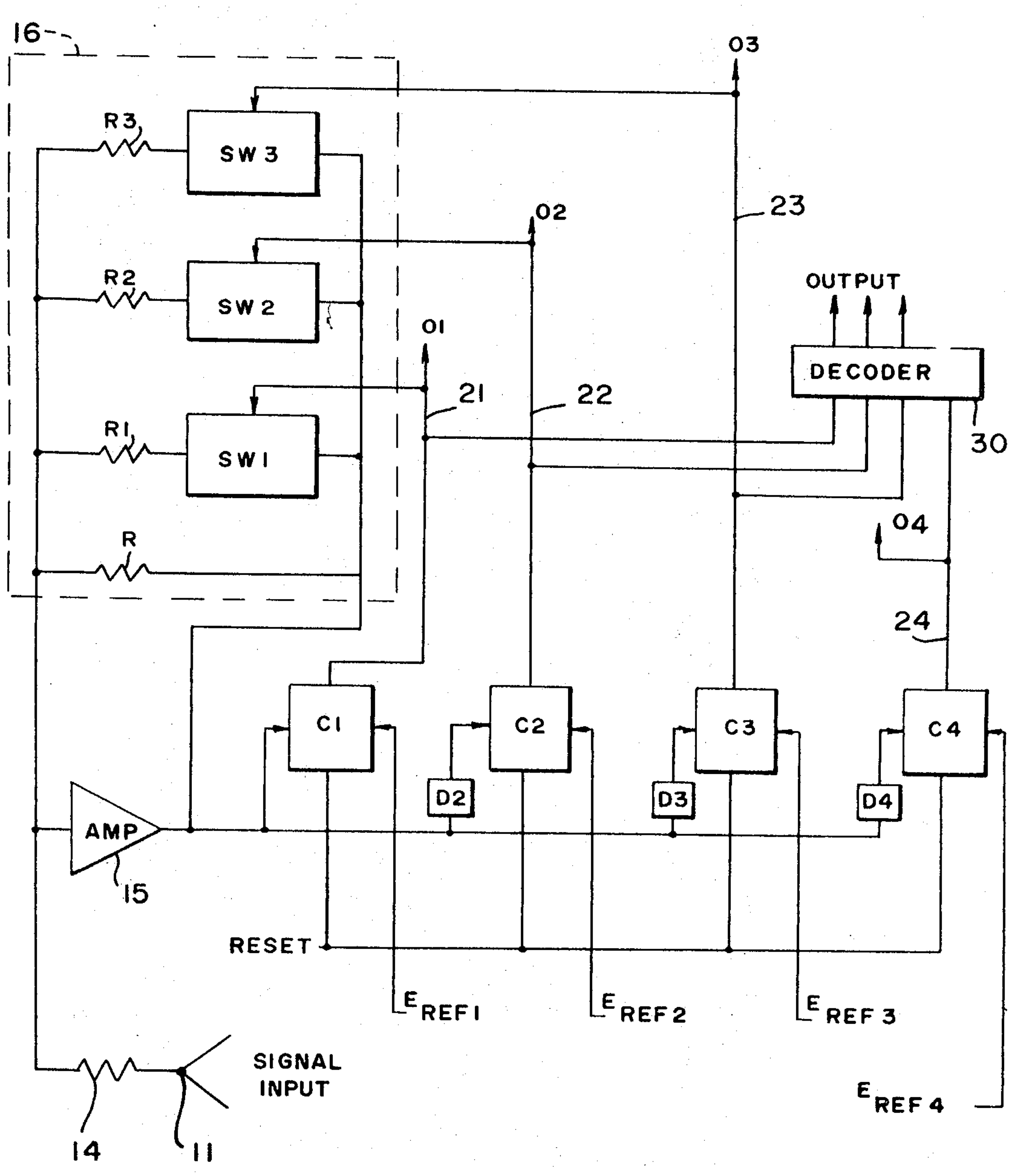
FIG. 5 is a block diagram of another embodiment of the invention.

Herebefore, it has been assumed that the input voltage has a ramp shape (see FIG. 2) so that at each measurement the input voltage is not less than the input voltage at a preceding measurement. The teachings may be employed to convert either input voltages, which vary randomly above a reference level, as represented by a line 31 in line *a* of FIG. 4, or input voltages of a square-shaped waveform as represented by line 32 in line *b* of FIG. 4. To convert such voltages, the basic embodiment shown in FIG. 1 is modified as shown in FIG. 5, wherein elements similar to those shown in FIG. 1 are designated by like numerals.

The modification consists of the incorporation of a separate delay unit at the input of each comparator from the amplifier output, except for the first comparator C1. In the 4-comparator embodiment, the delay units are designated D2, D3 and D4, respectively. Briefly, the function of each delay unit is to delay the supply of the amplifier output to its associated comparator by a time required for all proceeding comparators to perform their functions in series.

In operation, prior to the start of each measurement, four of which are designated in FIG. 4 by $t_1$–$t_4$, all the comparators are reset by a reset pulse. The four pulses preceding the four measurements are designated by numerals 51–54 in line *c* of FIG. 4. When the comparators are reset, their outputs are assumed to be false, which cause their associated switches to open. Then, the input voltage is applied. The amplifier output is directly supplied to C1 without delay. The latter is turned ON or remains in an OFF state, i.e., is set or not, depending on the input voltage amplitude. After a delay required for the determination of the state of C1 and switch SW1, a delay provided by D2, the amplifier output reaches C2. Its state and that of SW2 are then determined as a function of the input voltage amplitude and $E_{REF2}$.

In like manner, each of D3 and D4 delays the supply of the amplifier output to its associated comparator by the time required for the preceding comparators to be set if necessary. Thus, the total measurement interval equals the time required for the determination of the state of one comparator and its associated switch times the number of comparators. The successive determinations of the states of the comparators is necessary for the proper gain control to result in the desired digital representation, as herebefore explained.

There has accordingly been shown and described herein a novel ADC which includes a stable variable gain amplifier, and a plurality of comparators whose true outputs are used to control the gain of the amplifier. It is the combined outputs of the comparators which represent the converter's digital output. Although particular embodiments of the invention have been described and illustrated herein, it is recognized that modifications and variations may readily occur to those skilled in the art and consequently it is intended that the claims be interpreted to cover such modifications and equivalents.

What is claimed is:

1. An analog-to-digital converter comprising:

a variable gain amplifier to which a variable amplitude analog input signal is applied;

*n* amplitude comparators, *n* being equal or greater than 3 arranged in a sequence each directly comparing the amplitude of the analog output of said amplifier with a different amplitude threshold level for providing a true output only when the amplitude of the amplifier output signal is not less than the amplitude of the threshold level associated therewith; and wherein the first comparator in said sequence has an input line directly connected to the amplifier's output line and each subsequent comparator in said sequence has an input line connected to the amplifier's output line through a delay unit for delaying the supply of the amplifier's output to the comparator by a time required for the successive operations of all preceding comparators in said sequence, gain control means coupled to said amplifier and to the outputs of *n*–1 of said comparators for controlling the gain of said amplifier as a function of the comparators' outputs.

2. An analog-to-digital converter as described in claim 1 wherein said gain control means includes a plurality of resistors and a plurality of switch means, each switch means being coupled to a different resistor and responsive to a true output of one of the comparators associated therewith for connecting the resistor coupled thereto to said amplifier to control the gain thereof.

3. An analog-to-digital converter as described in claim 1 wherein the threshold level of each comparator in said sequence increases as a function of the comparator position in said sequence and the gain of said amplifier decreases as a function of the number of comparators providing true outputs.

4. An analog-to-digital converter as described in claim 1 wherein said amplifier is an operational amplifier and said gain control means includes a first resistor connected across said amplifier and a plurality of *n*–1 branch means which are connected in parallel with said first resistor, each branch means being associated with a different comparator of the first *n*–1 comparator in said sequence, each branch means including a resistor and a normally open switch which is closed when the comparator with which the branch means is associated provides a true output, thereby connecting the resistor of the branch means in parallel across said first resistor.

5. An analog-to-digital converter as described in claim 4 wherein the first comparator in said sequence having an input line directly connected to the amplifier's output line and each subsequent comparator in said sequence has an input line connected to the amplifier's output line through a delay unit for delaying the supply of the amplifier's output to the comparator by a time required for the successive operations of all preceding comparators in said sequence.

6. An analog-to-digital converter as described in claim 5 wherein the threshold level of each comparator in said sequence increases as a function of the comparator position in said sequence and the gain of said amplifier decreases as a function of the number of comparators providing true outputs.